(12) United States Patent
Lee

(10) Patent No.: US 8,241,057 B2
(45) Date of Patent: Aug. 14, 2012

(54) FPC CONNECTOR FOR ELECTRICALLY CONNECTING AN FPC TO PCB AND FPC-CONNECTION METHOD USING THE SAME

(75) Inventor: Jun-Ho Lee, Seongnam-si (KR)

(73) Assignee: Seung-Hee Lee, Seongnam-Si (KR)

( * ) Notice: Subject to any disclaimer, the term of this patent is extended or adjusted under 35 U.S.C. 154(b) by 0 days.

(21) Appl. No.: 13/002,473

(22) PCT Filed: May 4, 2009

(86) PCT No.: PCT/KR2009/002350
§ 371 (c)(1),
(2), (4) Date: Jan. 3, 2011

(87) PCT Pub. No.: WO2010/002099
PCT Pub. Date: Jan. 7, 2010

(65) Prior Publication Data
US 2011/0111606 A1      May 12, 2011

(30) Foreign Application Priority Data

Jul. 3, 2008    (KR) .................. 10-2008-0064338
Sep. 11, 2008   (KR) .................. 10-2008-0089990

(51) Int. Cl.
*H01R 12/24*    (2006.01)

(52) U.S. Cl. .................................................... 439/495
(58) Field of Classification Search .................. 439/67, 439/495
See application file for complete search history.

(56) References Cited

U.S. PATENT DOCUMENTS

| 6,074,221 A * | 6/2000 | Kajiwara ................ 439/67 |
| 7,374,429 B2 * | 5/2008 | Cronch et al. .......... 439/67 |
| 2007/0232127 A1 | 10/2007 | Lin |

FOREIGN PATENT DOCUMENTS

| JP | 8-102342 A | 4/1996 |
| JP | 2000-223188 A | 8/2000 |
| JP | 2004-296419 A | 10/2004 |
| JP | 2007-200624 A | 8/2007 |

* cited by examiner

*Primary Examiner* — Phuong Dinh
(74) *Attorney, Agent, or Firm* — Sughrue Mion, PLLC

(57) ABSTRACT

The present invention relates to an FPC connector for electrically connecting an FPC to contact portion of a wirings printed on a PCB, and to an FPC connection method using the same, wherein an FPC (10) is inserted into a housing (110) so that the contact portion of the FPC (10) may come in direct contact with a contact portion (2a) of the PCB, and an pressing member pressing the FPC (10) on the PCB so as to directly contact the FPC (10) to the PCB (1).

4 Claims, 6 Drawing Sheets

[Figure 1]
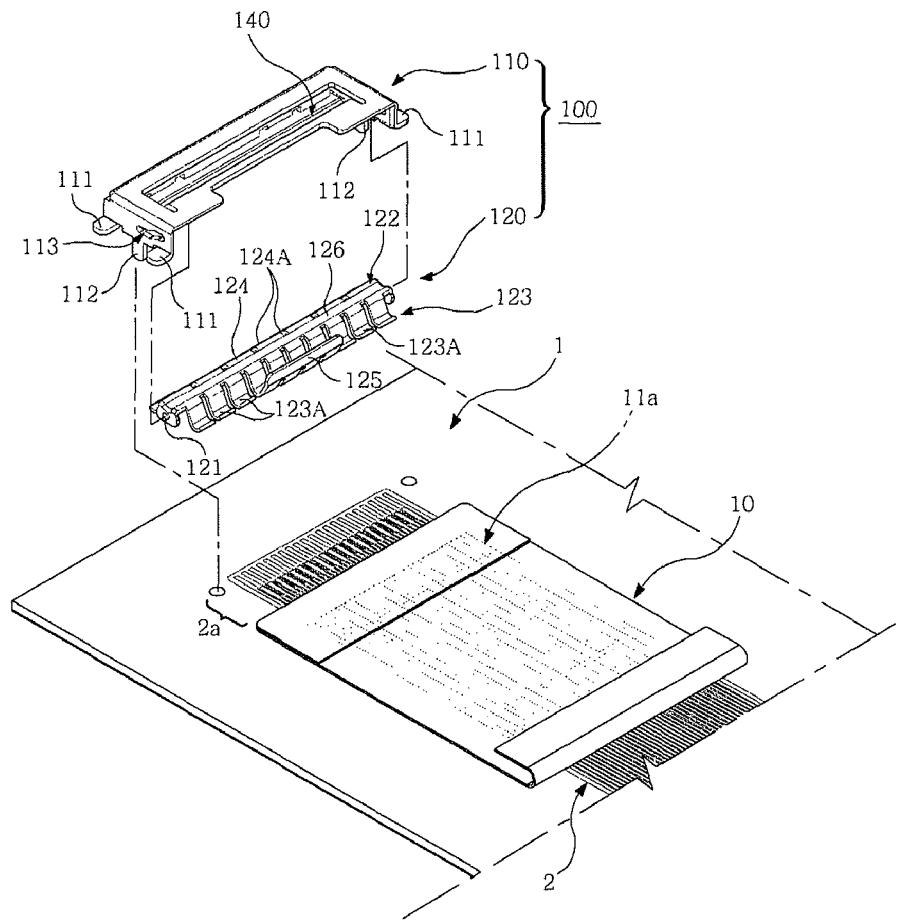
[Figure 2]
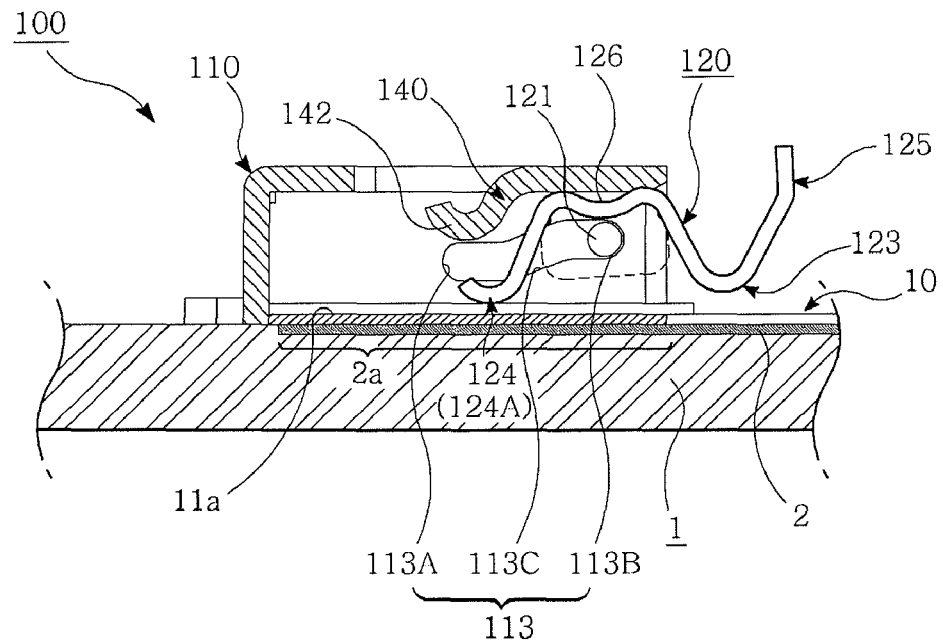

[Figure 3]
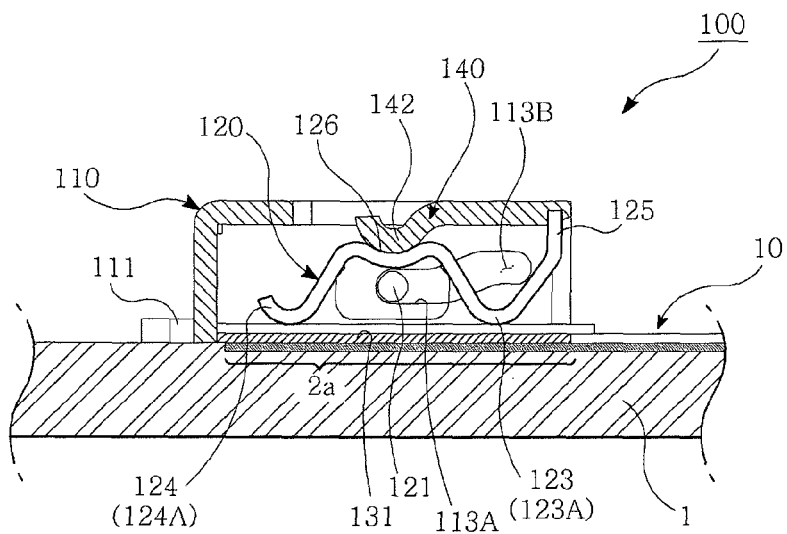
[Figure 4]
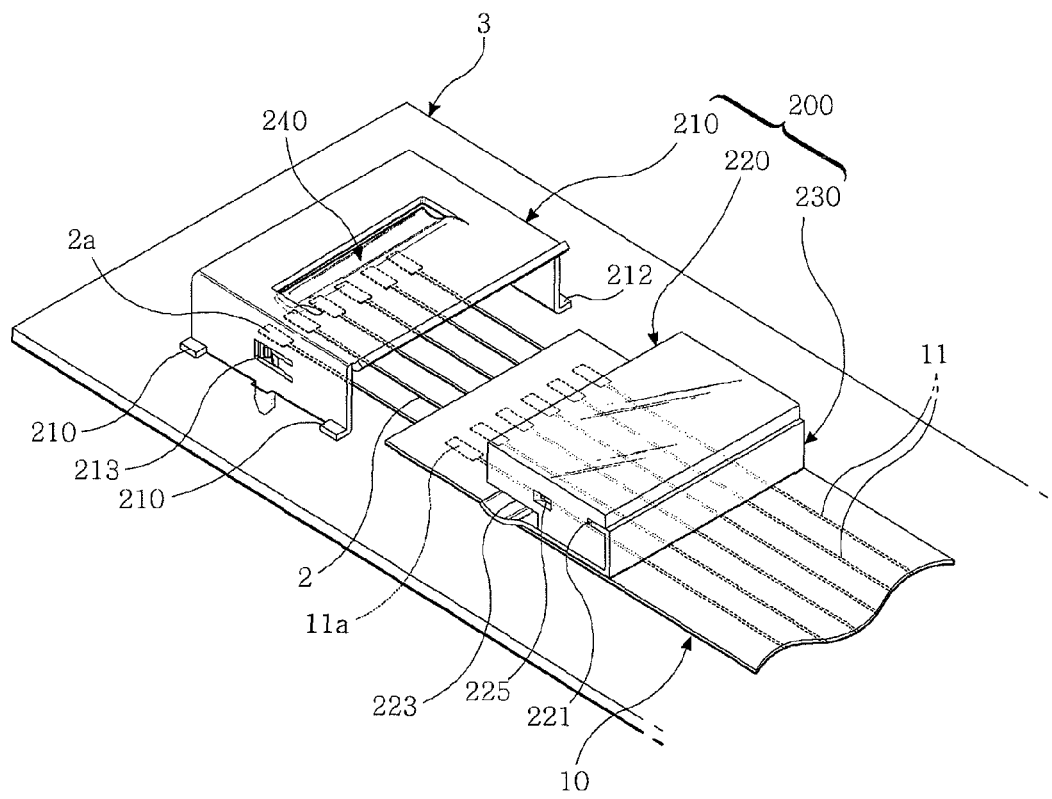

[Figure 5]
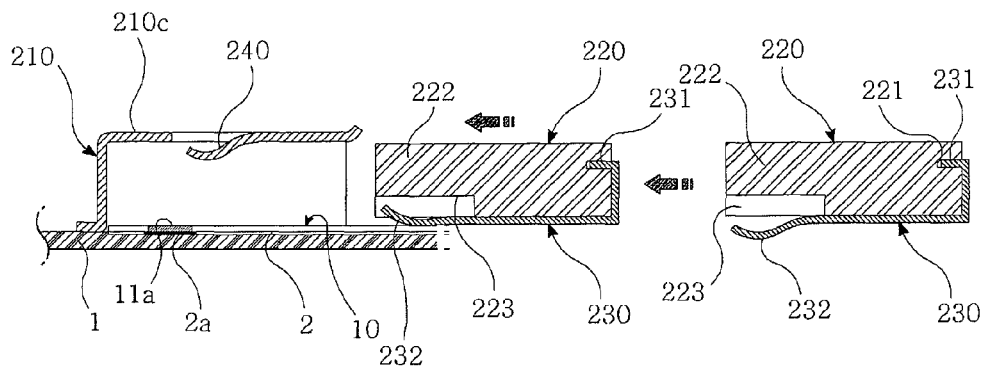
[Figure 6]
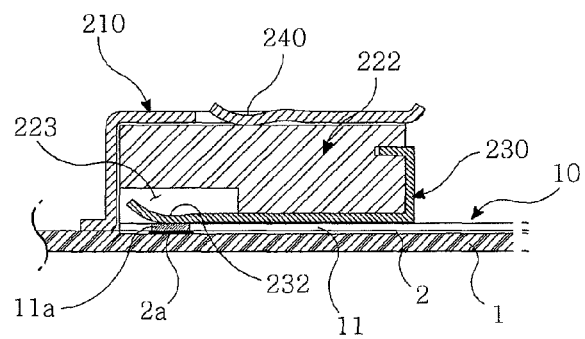
[Figure 7]
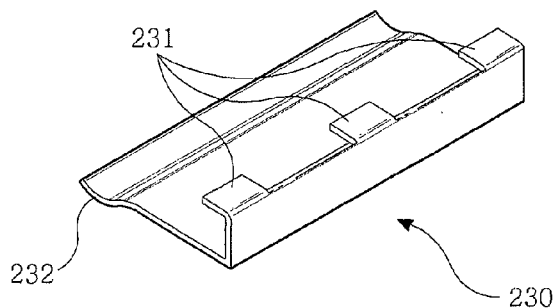

[Figure 8]
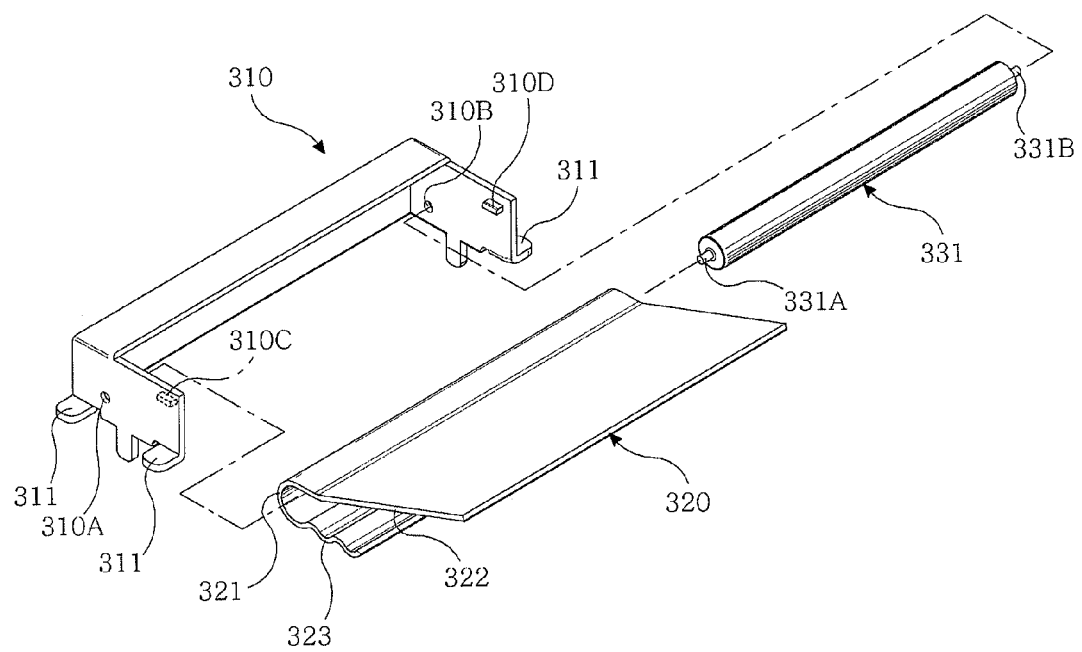

[Figure 9]
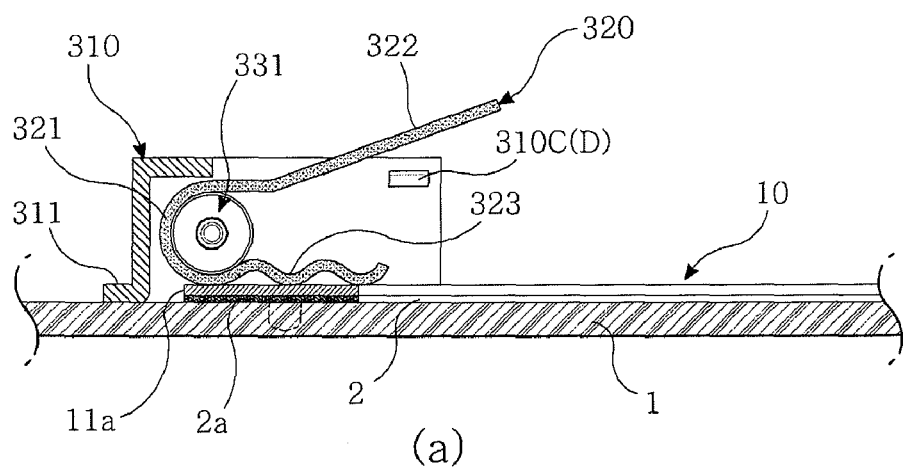
(a)
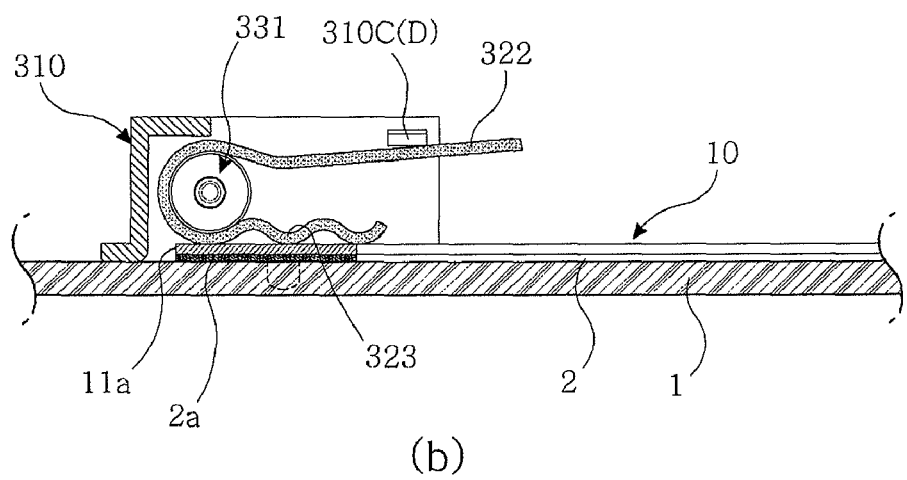
(b)

[Figure 10]
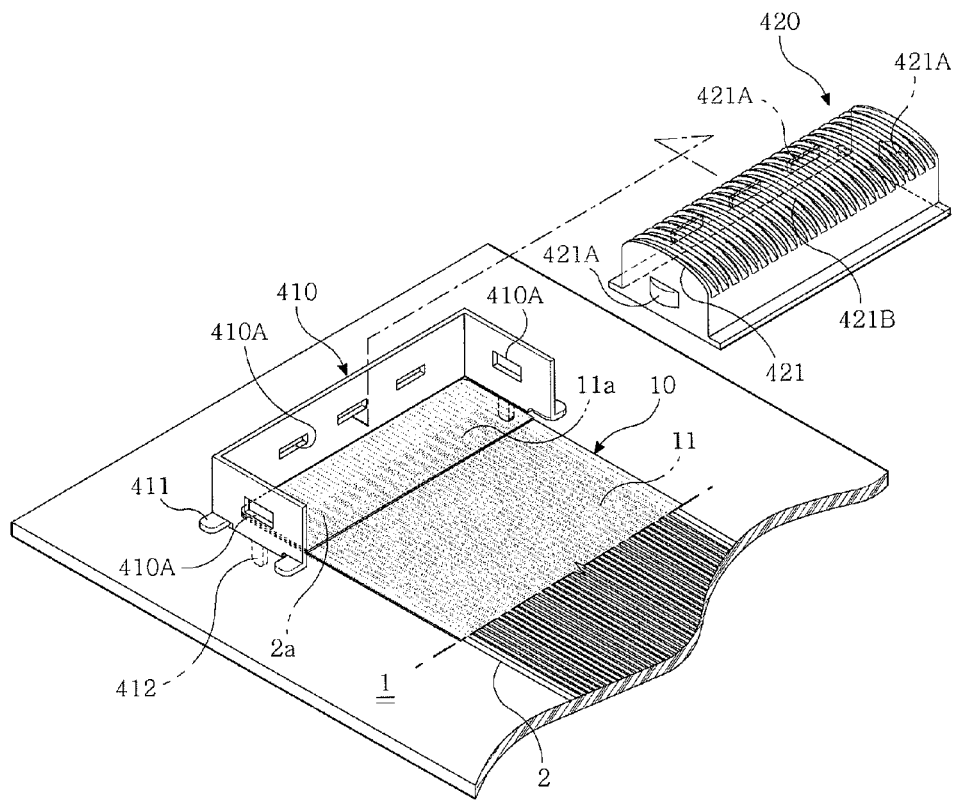
[Figure 11]
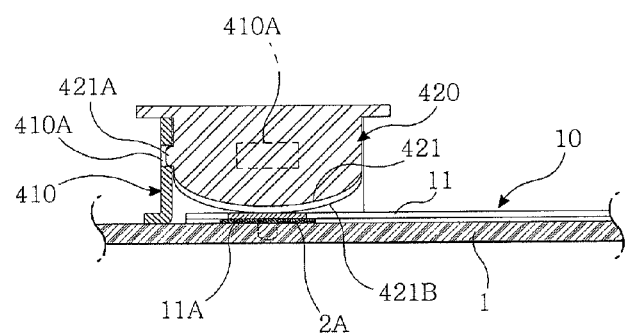

FPC CONNECTOR FOR ELECTRICALLY CONNECTING AN FPC TO PCB AND FPC-CONNECTION METHOD USING THE SAME

TECHNICAL FIELD

The present invention relates to an electric connector for electrically connecting a Flexible Printed Circuit (hereafter, referred to as "FPC") to a circuit board in electric devices, such as a mobile phone, PDA (Personal Digital Assistant), a notebook computer, etc.

BACKGROUND ART

Recently, an electronic device, such as a mobile phone, becomes smaller in its size and thus its components, such as electric connectors, mounted on the main circuit board are also required to be thin in thickness.

A connector for a FPC (hereafter, referred to as "FPC connector") or Flexible Flat Cable is mounted on the main PCB (Printed Circuit Board) in an electric device and used to electrically connect one end of the FPC to the main circuit board. The FPC connector comprises a plurality of contact pins to be in contact with wirings printed on the circuit board.

The contact pins are formed by bending thin metal sheet in press operation and thus fit in the insulator of the FPC connector.

The rear end portions of the contact pins in the conventional FPC connector are attached on the PCB and the front end portion are in contacted with uncovered ends of the corresponding wirings on the FPC to be connected. Therefore, the conventional FPC connector has the contact pins to fit in the grooves arranged on the insulating housing.

DISCLOSURE

Technical Problem

The conventional FPC connector has disadvantages in as follows:

First, it requires highly precise and expensive mold to make the contact pins, which causes production cost raised. Further, the connector assembly becomes smaller and thinner and further the contact pins are small-seized and the pitch between the contact pins is very narrow. These cause a rate of defection increased.

Also, the contact pins are thin and small, and thus they tend to be easily bent. This causes poor contact between contact pins and wirings on the PCB. Furthermore, the conventional connector is of a complex structure because it requires additional locking means to connect a FPC to the connector firmly.

Technical Solution

It is an object to provide a FPC connector for connecting a FPC or a FFC directly to the PCB of an electronic device, thereby eliminating disadvantages caused by contact pins of a connector.

Further, it is another object to provide method of connecting a FPC directly to a PCB of an electronic device, not by contact pins.

The FPC connector according to the present invention comprises: a housing mounted on a PCB of an electronic device to enclose end portions of electric wirings on the PCB, including a mouth portion being open at the front side to allow the end portion of the FPC to be inserted therethrough; and a pressing member for pressing the end portion of the FPC inserted in the housing on the end portions of electric wirings to be closely contact with each other.

The FPC connector according to the present invention further comprises retaining means for retaining the pressing member to the housing so as to keep the FPC pressed on the PCB.

The method of electrically connecting a FPC to PCB according to the present invention comprises: folding contact portion of wirings of the FPC on the ends of wirings on the PCB to directly connect the FPC with the wirings on the PCB; and pressing the FPC against the PCB with a pressing member so as to make the contact portion of wirings of the FPC to be in electrical contact with the wirings on the PCB.

The method according to the present invention further comprises retaining the pressing member to the housing in the state of pressing the FPC.

Advantageous Effects

According to the present invention, the total cost of production of the FPC connector can be reduced because it does not require contact pins to connect the FPC with the PCB. As the FPC and the wiring on the PCB are directly contact with each other, good connection without noise can be obtained. Also, assembling of the FPC connector becomes easy and simple.

DESCRIPTION OF DRAWINGS

FIG. 1 is an exploded perspective view of the first embodiment according to the present invention.

FIG. 2 is a sectional view of the first embodiment according to the present invention, before pressing the FPC.

FIG. 3 is a sectional view of the first embodiment according to the present invention, in the state that a pressing member presses a FPC against a PCB to contact the FPC with the wirings on the PCB.

FIG. 4 is an exploded perspective view of the second embodiment according to the present invention.

FIG. 5 is a sectional view of the second embodiment according to the present invention, in the state that the pressing member is not pressing the FPC against the PCB.

FIG. 6 is a sectional view of the second embodiment according to the present invention, of which the pressing member is pressing the FPC against the PCB to connect the FPC electrically to the PCB.

FIG. 7 is a perspective view of a pressing plate of the FPC connector according to the second embodiment.

FIG. 8 is an exploded perspective view of the third embodiment according to the present invention.

FIG. 9 is a sectional view of the third embodiment according to the present invention, of which the pressing member is pressing the FPC against the PCB.

FIG. 10 is an exploded perspective view of the fourth embodiment according to the present invention.

FIG. 11 is a sectional view of the third embodiment according to the present invention, of which the pressing member is pressing the FPC against the PCB.

BEST MODE

Hereafter, the preferred embodiments of the present invention will now be made in detail, with the accompanying drawings.

The First Embodiment of the Present Invention

FIGS. 1 to 3 show the first embodiment of the present invention.

The FPC connector 100 according to the first embodiment relates to a kind of 'Board-to FPC' connector, which electrically connects wirings 11 of FPC 10 with wirings 2 on PCB 1.

The PCB 1 has wirings 2 printed on the surface, which has contact portion 2a at the end. The contact portion 2a of the PCB 1 becomes in contact directly with the contact portion 11a of the FPC 10.

The FPC connector 100 according to the first embodiment of the present invention comprises a housing 110 fixed on the PCB 1, and a pressing member 120 pressing the FPC 10 inserted in the housing 110 against the PCB 1 to make the FPC 10 to be in contact with the PCB 1.

The housing 110 includes a plurality of fixing portions 111 and a plurality of mounting legs 112 on the side walls, with which the housing 110 is fixed on the PCB 1. The fixing portions 111 and the mounting legs are fixed on the PCB with the usual process, for example, soldering process.

As shown in FIG. 2, the housing 110 is mounted on the PCB 1 so as to cover the wiring contact portion 2a on the PCB 1. The housing 110 is open at the bottom so as to allow the wiring contact portion 2a to be placed therein.

Further, the housing 110 includes a mouth portion to be open at the front so as to allow the FPC 10 to be inserted therethrough. The wiring contact portion 11a of the FPC 10 in the housing 110 is placed on the contact portion 2a of wirings on the PCB 1 and becomes in direct contact with each other.

The FPC pressing member 120 is assembled to the housing 110 with connecting means. The connecting means connects the pressing member 120 to the housing 110 in a manner that the pressing member 120 moves between a lower position and an upper position. At the lower position, the pressing member 120 presses the FPC 10 against the PCB 1, and makes the FPC 10 unpressed at the upper position.

As shown in FIGS. 1 and 2, the connecting means comprises connecting pins 121 protruded from each of the side walls, respectively, and guide channels 113 on each of the side walls of the housing 110 to guide the connecting pins 121 slidably.

As shown in FIGS. 2 and 3, the guide channels 113 include the lower position 113a, the upper position 113b and inclined track 113c between the lower position 113a and the upper position 113b.

As shown in FIG. 3, when the connecting pins 121 are placed at the lower position 113a, the pressing member 120 gets pressing the FPC 10 placed in the housing 110 against the PCB 1 to make the contact portions 2a, 11a to be in close contact with each other. As shown in FIG. 2, the pressing member 120 releases the FPC 10 from the PCB 1 when the connecting pins 121 are placed at the upper position 113b.

As shown in FIGS. 1 to 3, the pressing member 120 comprises a central portion 122, a front pressing portion 123 and a rear pressing portion 124. The front pressing portion 123 is extended outwardly and inclined from one end of the central pressing portion 122. The rear pressing portion 124 is extended outwardly and inclined from the other end.

The front pressing portion 123 has a plurality of front segments 123a apart from each other with the space corresponding to that of wirings of the FPC. The rear pressing portion 124 has a plurality of rear segments 124a apart from each other with the space corresponding to that of wirings of the FPC. Each segment 124 presses the wiring corresponding to each of the segments, respectively.

Further, the pressing member 120 has a grip portion 125 outwardly extended upwardly from the middle portion of the front segment 123a.

As shown in FIGS. 1 to 3, the housing has biasing means 140 elastically biasing the FPC pressing member 120 toward the PCB 1 and also holding the FPC pressing member 120 located at the pressing position.

The biasing means 140 has a pressing protrusion 142 which is formed by bending side wall of the housing 110 inwardly.

The FPC pressing member 120 has a groove 126 longitudinally formed on the central portion 122. The pressing protrusion 142 is placed on the groove 126.

According to the present invention, the total cost of production of the FPC connector can be reduced because it does not require contact pins to connect the FPC with the PCB. As the FPC and the wiring on the PCB are directly contact with each other, good connection without noise can be obtained. Also, assembling of the FPC connector becomes easy and simple.

The Second Embodiment of the Present Invention

FIGS. 4 to 7 show the FPC connector according to the second embodiment of the present invention.

As shown in FIG. 4, the FPC connector 200 according to the second embodiment comprises a housing 210 fixed on the PCB 1, and a pressing member 220 pressing contact portion 11a of the FPC 10 in the housing 210 against the PCB 1 so as to make the contact portion 11a of the FPC 10 to be in contact with contact portion 2a of wirings 2 on the PCB 1.

The housing 210 includes a plurality of fixing portions 211 on the side walls, with which the housing 210 is fixed on the PCB 1. The fixing portions 211 are fixed on the PCB with soldering.

The housing 210 is fixedly mounted on the PCB 1 so as to cover the wiring contact portion 2a on the PCB 1. The housing 210 is open at the bottom so as to allow the wiring contact portion 2a to be placed therein.

The housing 210 includes a biasing member 240 for pressing the pressing member 220. The biasing member 240 is formed by bending side wall of the housing inwardly.

As shown in FIGS. 4 and 5, the pressing member 240 comprises a block 222 and a pressing plate 230 attached to the block 222. The block 222 has grooves 225 on the side walls for receiving protrusions on the housing 210.

As shown in FIGS. 4 and 7, the pressing plate 230 is attached to the rear wall of the block 222 and includes a pressing portion 232 for pressing the FPC 10 against the FPC 1. Preferably, the pressing plate 230 is made by forming metal sheet and insert-molded in the block 222.

The Third Embodiment of the Present Invention

FIGS. 8 and 9 show the FPC connector according to the third embodiment of the present invention.

As shown in FIGS. 8 and 9, the FPC connector 300 according to the third embodiment comprises a housing 310 fixed on the PCB 1, and a pressing member 320 pressing contact portion 11a of the FPC 10 in the housing 310 against the PCB 1 so as to make the contact portion 11a of the FPC 10 to be in contact with contact portion 2a of wirings 2 on the PCB 1.

The housing 310 includes a plurality of fixing portions 311 on the side walls, with which the housing 310 is fixed on the PCB 1. The fixing portions 311 are fixed on the PCB with soldering.

The pressing member 320 comprises a sleeve portion 321 rotatably supporting a shaft member 331, a finer plate 322 extended from the sleeve portion 321, and a pressing plate 323 for pressing the FPC 1. The housing 310 further comprises stoppers 310C,310D for holding the pressing plate 323 at the lower position.

The Fourth Embodiment of the Present Invention

FIGS. 10 and 11 show the FPC connector according to the fourth embodiment of the present invention.

As shown in FIGS. 10 and 11, the FPC connector 400 according to the fourth embodiment comprises a housing 410 fixed on the PCB 1, and a pressing member 420 for pressing contact portion 11a of the FPC 10 in the housing 410 against the PCB 1 so as to make the contact portion 11a of the FPC 10 to be in contact with contact portion 2a of wirings 2 on the PCB 1.

The housing 410 includes a plurality of fixing portions 411 on the side walls, with which the housing 410 is fixed on the PCB 1. The fixing portions 411 are fixed on the PCB with soldering.

The housing 410 has an opening at the top surface, and the pressing member 420 is assembled through the opening.

The pressing member 420 comprises a body 421 having a pressing portion 422 and protrusions 421A being fitted in grooves 410A on the side walls.

Further, the pressing portion 422 has a plurality of pressing ribs for pressing the wirings on the FPC.

The invention claimed is:

1. A FPC connector for electrically connecting a FPC to a PCB of electric devices, which comprises:
    a housing 110 having side walls and an upper wall, the housing 110 being open at a front side to form a mouth portion to allow a contact portion 11a of the FPC 10 to be inserted therethrough and mounted on the PCB 1 so as to enclose a contact portion 2a of electric wirings 2 on the PCB 1; and
    a pressing member 120 for pressing the contact portion 11a of the FPC 10 in the housing 110 on the contact portion 2a of electric wirings 2 of the PCB 1 to be directly contact with each other;
    connecting means for connecting the pressing member 120 to the housing 110 in a manner that the pressing member 120 slidably moves between a lower position 113a and an upper position 113b,
    wherein the connecting means comprises connecting pins 121, each connecting pin being protruded from each of side walls of the pressing member 120 and guide channels 113 formed on each of the side walls of the housing 110 so as to guide the connecting pins 121 slidably, wherein each of the guide channels 121 includes the lower position 113a, the upper position 113b and inclined track 113c between the lower position 113a and the upper position 113b.

2. The FPC connector according to claim 1, further comprising biasing means for elastically biasing the pressing member 120 toward the PCB 1 so as to make the pressing member 120 to be held at the lower position 113a.

3. The FPC connector according to claim 2, wherein the biasing means 140 comprises a pressing protrusion 142 formed by bending the upper wall of the housing 110 inwardly, and wherein the pressing member 120 has a groove 126 for receiving the pressing protrusion 142 therein.

4. The FPC connector according to claim 1, wherein the pressing member 120 comprises a front pressing portion 123 outwardly extended from one end and a rear pressing portion 124 outwardly extended from the opposite end.

* * * * *